United States Patent [19]

Westervelt et al.

[11] Patent Number: 4,767,643

[45] Date of Patent: Aug. 30, 1988

[54] METHOD OF CONTINUOUSLY VACUUM IMPREGNATING FIBROUS SHEET MATERIAL

[75] Inventors: Dean C. Westervelt, Bullskin; Wei-Fang A. Su, Murrysville, both of Pa.

[73] Assignee: Westinghouse Electric Corp., Pittsburgh, Pa.

[21] Appl. No.: 888,292

[22] Filed: Jul. 22, 1986

[51] Int. Cl.$^4$ .................... B05D 3/06; B05D 3/00; C23C 14/00
[52] U.S. Cl. .................... 427/54.1; 427/53.1; 427/294; 427/296; 118/50
[58] Field of Search .......... 427/294, 296, 53.1, 427/54.1; 118/50, 413, 415

[56] References Cited

U.S. PATENT DOCUMENTS

| | | | |
|---|---|---|---|
| 1,338,624 | 4/1920 | Heppes et al. | 427/296 |
| 3,616,194 | 10/1971 | Russel | 156/189 |
| 3,644,137 | 2/1972 | Fox et al. | 118/50 |
| 3,826,703 | 7/1974 | Russel | 156/189 |
| 3,832,973 | 9/1974 | Beissel et al. | 118/50 |
| 3,881,445 | 5/1975 | Nothiger | 118/50 |
| 4,045,598 | 8/1977 | Henson | 427/296 |
| 4,092,443 | 5/1978 | Green | 427/53.1 |
| 4,112,146 | 9/1978 | Lazear | 427/54.1 |
| 4,288,475 | 9/1981 | Meeker | 427/294 |
| 4,327,143 | 4/1982 | Alvino et al. | 428/236 |
| 4,440,808 | 4/1984 | Mitter | 427/294 |
| 4,477,512 | 10/1984 | Thomas ewt al. | 428/236 |

FOREIGN PATENT DOCUMENTS 747299 3/1970 Belgium .................... 427/296

Primary Examiner—Norman Morgenstern
Assistant Examiner—Marianne L. Padgett
Attorney, Agent, or Firm—Daniel P. Cillo

[57] ABSTRACT

A void-free prepreg is made by contacting a porous sheet material with a resin so that resin enters the sheet, providing a subatmospheric pressure on one side of the resin-containing sheet to draw resin through the sheet, and then B-staging the resin-containing sheet.

6 Claims, 1 Drawing Sheet

U.S. Patent    Aug. 30, 1988    4,767,643
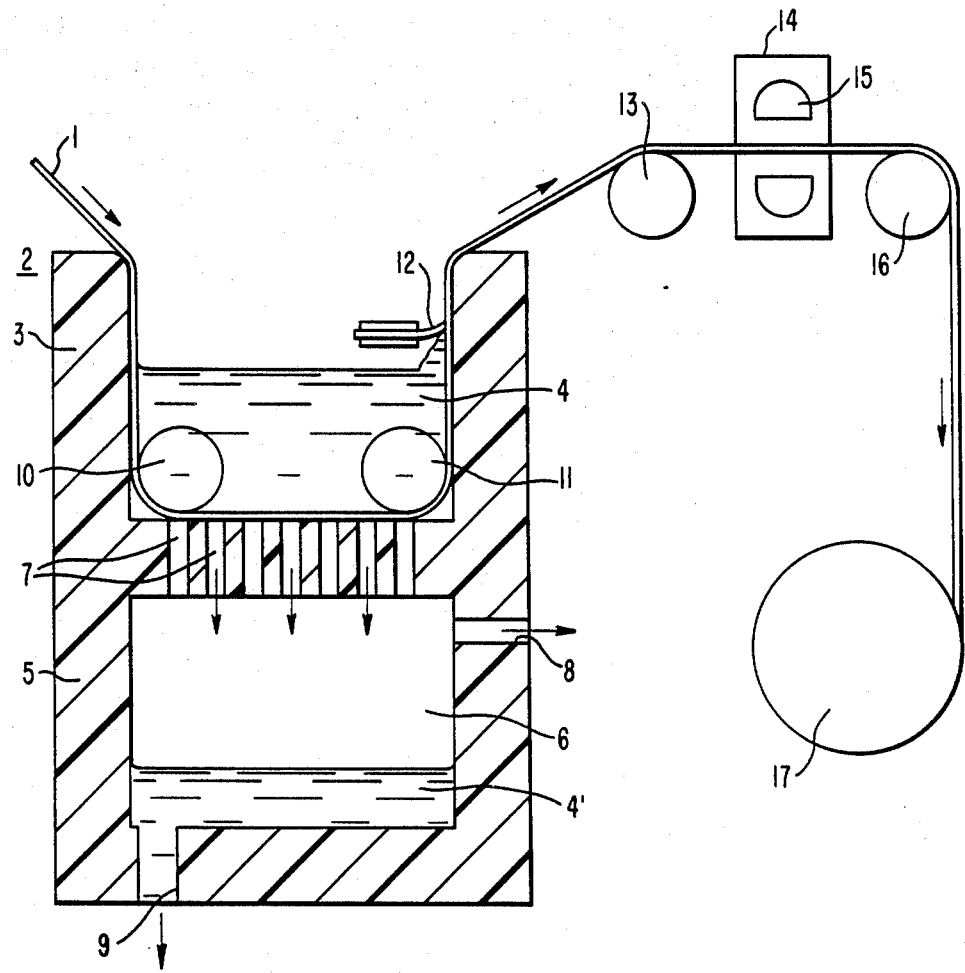

METHOD OF CONTINUOUSLY VACUUM IMPREGNATING FIBROUS SHEET MATERIAL

BACKGROUND OF THE INVENTION

Resin impregnated fibrous sheet dried to the B-stage (prepreg), especially epoxy resin impregnated glass cloth, has been used in manufacturing high-pressure laminates for the printed circuit board industry. Usually, an epoxy resin-curing agent system, dissolved in an organic solvent to provide a resinous solution, is impregnated into a passing fibrous sheet in a closed-bottom resin bath. The impregnated sheet is then generally passed through a drying oven to B-stage the resin, i.e., remove sufficient solvent so that the resin is dry to the touch, capable of being wound on a reel or cut into sheets and stacked for storage without blocking, and also capable of further cure to the completely cured C-stage. Such processes are taught by Alvino et al., in U.S. Pat. No. 4,327,143, and Thomas et al., in U.S. Pat. No. 4,477,512.

Recently, stringent restrictions on volatile organic compound (VOC) emissions have curtailed the use of some resinous impregnating solutions. The prepreg prepared by a conventional web-coating process also has problems with air being trapped in the prepreg. A void-free prepreg is necessary for producing a void-free laminate with optimum electrical, and physical properties. A variety of vacuum-resin impregnation processes, such as those taught by Russel, in U.S. Pat. Nos. 3,616,194 and 3,826,703; Fox et al., in U.S. Pat. No. 3,644,137; and, Nothiger, in U.S. Pat. No. 3,881,445, have attempted to eliminate air trapped in a fibrous sheet prior to sheet impregnation. Most of these processes, however, are complicated and expensive, and many require vacuum-tight seals. Other means of impregnating woven and non-woven flexible materials with high solids, solventless resin systems are needed.

SUMMARY OF THE INVENTION

The above need has been met and the above problems solved, by impregnating porous, flexible sheet materials with an insulating resin composition by: (1) contacting a first side of the porous sheet with the resin, so that the resin enters the sheet, (2) passing the resin-containing sheet near a vacuum means, (3) providing a subatmospheric pressure on the second side of the sheet effective to draw resin and any air in the sheet through the sheet. More specifically, a woven or non-woven, flexible, porous, fibrous sheet material is passed into a resin bath preferably containing a solventless resin composition, so that resin enters the sheet. The resin-containing sheet is then drawn over perforations in the bath wall which perforations communicate to a vacuum means containing a vacuum chamber reservoir. The resin-containing sheet thus has a first side in contact with resin and a second side in contact with the perforations.

A vacuum is then drawn on the second side of the resin-containing sheet, effective to draw resin and any air in the sheet, through the sheet and into the vacuum chamber reservoir. Displaced air from the sheet is replaced with resin contacting the first side of the sheet, filling all voids in the sheet. The completely impregnated, void-free sheet is then passed to a means to B-stage the resin. Preferably, the resin composition will contain photoinitiators and the resin will be B-staged by a U.V. (ultraviolet) light source.

High solids epoxy resins, polyester resins, phenolic resins, polyurethane resins, and their mixtures, provide useful impregnants. High viscosity resins pose no problems to this process, because air-bubble removal depends on the pressure drop across the sheet. Higher viscosity resins result in a greater pressure drop leading to larger bubble formation and easier removal of air bubbles from the sheet. No vacuum-tight seals are necessary for introducing the sheet. The process is both simple and inexpensive, and in most instances a low vacuum, i.e., from about 10 inches to 15 inches of mercury is sufficient.

BRIEF DESCRIPTION OF THE DRAWING

For a better understanding of the invention, reference may be made to the preferred embodiments exemplary of the invention, shown in the accompanying drawing, which shows a schematic illustration of one method to continuously vacuum impregnate resin into a passing sheet, and provide a B-staged, void-free resin-impregnated prepreg, using a seal-less resin impregnating apparatus.

DESCRIPTION OF THE PREFERRED EMBODIMENT

Referring now to the Drawing, showing one embodiment of the method of this invention, a woven or non-woven, flexible, porous, fibrous sheet material 1, such as glass cloth or mat; cellulosic paper, for example Kraft paper; carbon fiber paper; cotton fabric or mat; Dacron, i.e., polyethylene terephthalate fabric; polyamide fabric or paper; and the like is passed at a rate of from about 6 ft/min to 100 ft/min, depending on bath and curing section length, to a two-chamber resin applicator 2. The applicator 2 contains a resin bath chamber section 3 containing resin 4, preferably a thermosettable, 100% solids epoxy type or polyester resin system containing a suitable curing agent and photoinitiator. The applicator 2 also contains a resin suction section 5 comprising vacuum chamber 6 which has a lower resin reservoir portion as shown.

A screen or a series of slots or perforations or other type openings 7 connect or communicate between the resin-containing section 3 and the vacuum chamber section 6. The two-chamber applicator can be made of any suitable plastic or metal material. Vacuum exhaust opening 8 leads to a suitable vacuum pump, not shown. A resin exhaust opening 9 leads to a resin pump, not shown. The vacuum pump should be capable of providing a subatmospheric pressure of up to about 20 inches of mercury, although a vacuum of only from about 10 inches to about 15 inches of mercury will usually suffice for the process. No vacuum-type seals are necessary, because the seal is formed by the passing web and the viscous liquid resin. In fact, the impregnation stage is in open communication with the vacuum chamber.

The flexible, porous sheet 1 passes into the resin bath in chamber 3 so that resin 4 enters the sheet, which sheet necessarily has air trapped in the interstices of its porous cross section. The resin-containing sheet passes under guide roller means 10 and then passes near the vacuum means, being passed next to and over the perforations 7 in the bottom of the bath wall, which perforations communicate to the vacuum chamber 6. The resin-containing sheet has its topside in contact with the impregnating resin 4 and its second side in contact with the perforations 7. A vacuum is then drawn on the second side by means of a vacuum pump.

The subatmospheric pressure resulting in chamber 6 is effective to draw or force a portion of the resin in the sheet and any air in the sheet, through the sheet cross-section and into the vacuum chamber reservoir, where the drawn-off resin 4' accumulates at the bottom of the vacuum chamber. The diameter and numbers of perforations 7 are of such size and quantity as are effective to allow a vacuum of up to 20 inches of mercury on the passing sheet. Preferably, the sheet thickness is from about 1 mil to about 25 mils (0.001 in. to about 0.025 in.). Over about 25 mils, it is difficult to use a U.V. cure on the resin. The displaced resin and air from the sheet is replaced with resin from the bath that contacts the topside of the sheet filling all voids in the sheet. The sheet acts as a barrier means or filter to excessive resin flow into the vacuum chamber.

The subatmospheric pressure is effective to allow the air trapped in the interstices of the sheet to expand and be easily swept out by the flow of resin. The higher the viscosity of the resin 4, the greater the pressure drop generated across the sheet cross-section, leading to larger air-bubble formation and easier removal of the air bubbles from the sheet. Thus, the viscous resin is forced through the sheet by the differential between atmospheric pressure acting on the resin and a partially evacuated chamber below the web. If the two-chamber applicator 2 were made of metal, it could be heated to utilize resins which are solids at room temperature but could be applied as a hot-melt. In a commercial treater, the drawn-off resin 4' could be continually pumped through exhaust opening 9 from the lower chamber against the partial vacuum and, after de-gassing, returned and recirculated to the upper chamber, making the process entirely continuous with resin recycle.

After the vacuum impregnation, the resin-impregnated, void-free sheet is passed beneath roller means 11, up the side of the resin bath and between the bath wall and a resin-wiping or metering means 12, to remove excess resin which drains back into the resin bath. The resin-impregnated sheet is then passed over guide roller 13 and into some form of curing means 14 such as a drying oven, or a bank of ultraviolet (U.V.) light sources shown as 15 (if U.V. light curable components have been included in the resin formulation) to B-stage the resin in the sheet. This provides a tack-free, dried, void-free, completely resin-impregnated, flexible pre-preg substrate sheet. This sheet is then passed over guide roller 16 and onto take-up reel 17 where it is wound for storage. The sheet can also be cut into sections, stacked and stored. Preferably, the prepregs can be stored up to about 6 months or longer without blocking.

When ready for use, the prepregs can be cut to size, stacked to form a plural layer stack-up, or stacked with other layers of materials. One or more layers of metal foil, such as copper or aluminum foil, may be disposed on top of or between layers of the stack-up. The stack-up can then be high-pressure laminated between press plates (usually at 125° C. to 175° C. and 1000 psi to 1500 psi) for a time effective to provide a consolidated, unitary, bonded laminate, for example a metal-clad laminate useful for printed circuitry. Rolled prepreg can also be used in continuous laminating processes.

Useful insulating, impregnating resins include epoxy resins, polyester resins, phenolic resins, polyurethane resins, their mixtures, and the like thermosetting resins. As mentioned previously, the preferred resin system contains 100% solids, with no organic solvent. Minor amounts of solvent can be used, however. Viscosity of the resin system can range as low as about 200 cps at 25° C., but is preferably about 2000 cps at 25° C., or higher. As pointed out before, very viscous resin systems can be used, eliminating the need for thinning solvents.

Useful epoxy resins are well known in the art and include diglycidyl ethers of bisphenol A, epoxy novolacs, and cycloaliphatic epoxy resins. These resins may be pre-brominated or they may be made using a brominated bisphenol material to impart better flame resistance to the laminate. These resins may also contain epoxidized oils acting as internal flexibilizers. Useful curing agents may include acid anhydrides, phenolic novolac oligomers, dicyandiamide, or the like well-known materials. Optional, well known catalysts can include amines, imidazoles and the like. Additives such as antimony trioxide, antimony pentoxide and various phosphates, all well known in the art, may also be included in minor amounts to impart an additional degree of fire or flame resistance to the product. Such epoxy resin systems are described in detail, for example, in U.S. Pat. Nos. 4,327,143 and 4,477,512, herein incorporated by reference.

Particularly useful and preferred epoxy resins also contain an acrylic resin or an epoxy-acrylic diluent component, such as that taught, for example, by U.S. Pat. No. 4,412,048; or a mixture of acrylated epoxy, acrylated blocked isocyanate, monoacrylate, and polyacrylate, such as that taught, for example by U.S. Pat. No. 4,481,258, both patents herein incorporated by reference.

Useful polyester resins would contain an alkyd component, generally made by condensing a polyhydric alcohol with a dicarboxylic acid. The alkyd component could then be copolymerized with a reactive acrylic monomer. Such resin systems are well known in the art and described in detail, for example, in U.S. Pat. No. 4,154,896, herein incorporated by reference. Phenolic resins are also useful and are, of course, very well known and very old in the art. Reference may be made to Brydson, *Plastics Materials,* D. Van Nostrand Co., 1966, Chapter 19, herein incorporated by reference, for a complete description of phenolic resins. Polyurethane resins, the reaction product of an isocyanate and an alcohol, are also useful in this invention and are also very well known and very old in the art. Reference may be made to Brydson, *Plastics Materials,* D. Van Nostrand Co., 1966, Chapter 23, herein incorporated by reference, for a complete description of polyurethane resins. The resin used is not critical. Standard curing agents or U.V. curing agents can be used. Epoxy types, including those with acrylic and or isocyanates, and polyesters are preferred.

If U.V. cure is to be used, the described resin systems should include a U.V. photosensitizer or initiator. A U.V. initiator is a compound which is stable in the resin in the absence of U.V. light but which initiates the cure of the U.V. curable resin in the presence of U.V. light. If the U.V. curable resin is an epoxy resin, the U.V. initiator should be a compound which, in the presence of U.V. light, liberates a Lewis acid or a Bronsted acid or both. A Lewis acid is a compound which donates electrons and a Bronsted acid is a compound which donates protons. Suitable compounds which produce both Lewis acids and Bronsted acids in the presence of U.V. light include iodonium salts, sulphonium salts phosphonium, arsonium salts and diazonium salts. Iodonium salts and phosphonium are preferred as they are readily available. Useful U.V. initiators for polyester-acrylic resin systems would include, for example, benzophene, diethoxyacetophenone, benzoin methyl ether, benzoin ethyl ether, benzoin isopropyl ether, benzoin isobutyl ether, chlorothioxanthanone, azo-bis-isobutyronitrile, their mixtures, mixtures of N-methyl diethanolamine-benzophenone and the like.

EXAMPLE

A dual chamber vacuum pressure impregnation resin applicator, similar to that shown in the Drawing, was constructed out of plexiglass. Its dimensions were about 3¼ inches square and about 4¼ inches deep. It contained a 1½ inch deep resin bath with two ½ inch diameter stainless steel guide bars at the bottom, and a 1½ inch deep vacuum chamber with a resin reservoir. A series of ⅛ inch wide slots holes centered ¼ inch apart connected the resin bath chamber and the vacuum chamber. A rubber wiper was used above the resin bath to meter the resin.

A flexible, porous, ½ inch × 0.005 thick, glass cloth ribbon was fed at a rate of about 20 feet/minute into 100% solids, U.V. light curable, epoxy-acrylic type resin contained in the bath which permeated the glass cloth. The resin had a viscosity at the 25° C. operating temperature of the applicator of about 4000 cps. The resin was a solventless, 100% solids, U.V.-curable composition containing: 20 wt. % to 40 wt. % of an acrylated epoxy which was the reaction product of an epoxy resin and an anhydride acrylate adduct; 4 wt. % to 15 wt. % of an acrylated blocked isocyanate; 45 wt. % to 65 wt. % monoacrylate; 5 wt. % to 20 wt. % polyacrylate; and 2 wt. % to 5 wt. % photo-initiator. The acrylated epoxy was the reaction mixture of: (1) trimellitic anhydride plus 2-hydroxyethyl acrylate and benzoquinone, and (2) bisphenol A epoxy resin, having an epoxy equivalent weight of 2200, plus phenoxy ethyl acrylate and triethanolamine. The acrylated blocked isocyanate was the reaction mixture of: (1) toluene diisocyanate plus 2-hydroxy ethyl acrylate and benzoquinone, (2) caprolactam, and (3) phenoxy ethyl acrylate. The monoacrylate was phenoxy ethyl acrylate, and the polyacrylate was tetraethyleneglycol diacrylate, prepared as taught by Example 12 of U.S. Pat. No. 4,481,258, herein incorporated by reference.

The glass cloth was passed around the guide bars, as shown in the Drawing, and across the series of openings where a vacuum of 12 inches of mercury was applied using a mechanical vacuum pump. Resin and trapped air were sucked through the sheet and into the vacuum chamber. Excess resin was collected at the bottom of the vacuum chamber.

The resin-impregnated glass cloth ribbon was then passed by a rubber metering wiper to remove excess surface resin, then out of the applicator and between a 300 watt mercury Fusion System U.V. light source and a metal reflector. Total exposure of the U.V. light to the resin was from about 3 seconds to 5 seconds. The resin in the glass cloth ribbon was advanced to the B-stage by the action of U.V. light exposure, i.e. dry to the touch but still capable of further cure. Subsequent examination of the resin-impregnated glass cloth under a 10× microscope disclosed no air voids in the cross-section and complete resin impregnation. The resulting prepreg would be suitable as a core sheet for making printed circuit boards. The method provided a simple and inexpensive vacuum impregnation process and the resin used and U.V. cure eliminated any harmful volatiles.

We claim:

1. A method of vacuum-impregnating a flexible, porous sheet material with resin comprising the steps:
   (A) passing a flexible, porous sheet material, necessarily containing air in its interstices, into a resin applicator comprising: (1) a resin chamber containing liquid, organic, termosettable impregnating resin, and (2) a vacuum chamber; which resin chamber has openings communicating to the vacuum chamber, where no vacuum-tight seals are necessary for passing the sheet material through the resin applicator,
   (B) passing the porous sheet material through the liquid resin in the resin chamber, so that liquid resin enters the sheet,
   (C) passing the resin-containing sheet next to the resin chamber openings and providing a subatmospheric pressure on the side of the sheet facing the openings to draw resin and trapped air through the sheet and through the resin chamber openings so that the sheet is completely filled with the resin, and where substantially all the air initially in the sheet is removed,
   (D) collecting liquid resin drawn off through the resin chamber openings in a reservoir in the vacuum chamber, and
   (E) advancing the resin-containing sheet to the B-stage of cure, to provide a resin-impregnated prepreg.

2. The method of claim 1, where the resin collected in step (D) is degassed and recirculated to the resin chamber.

3. The method of claim 1, where a vacuum of from about 10 inches to about 20 inches of mercury is applied in step (C), creating a pressure differential between atmospheric pressure acting on the resin in the bath chamber and the subatmospheric pressure in the vacuum chamber which pressure differential forces resin into and through the sheet filling all the interstices of the sheet with resin.

4. The method of claim 1, where the resin is an organic thermosettable resin having a viscosity at 25° C. greater than about 200 cps.

5. The method of claim 1, where the resin is selected from the group consisting of 100% solids, epoxy containing resin containing U.V. light curable components, and 100% solids, polyester containing resin containing U.V. light curable components, and in step (E) the resin-containing sheet is B-staged by passing it next to a U.V. light source.

6. The method of claim 1, where the resin chamber and the vacuum chamber are each single chambers disposed next to each other with the resin chamber integral with and over the vacuum chamber, the sheet material acts as a barrier means to excessive resin flow into the vacuum chamber, guide rollers control passage of the sheet next to and over the resin chamber openings, said openings being at the bottom of the resin chamber, and the resulting prepreg is void free.

* * * * *